United States Patent [19]
Ternes

[11] Patent Number: 5,479,723
[45] Date of Patent: Jan. 2, 1996

[54] IMAGE REGISTRATION BOARD

[75] Inventor: Gretchen Ternes, Shoreview, Minn.

[73] Assignee: Ternes-Burton Company, St. Paul, Minn.

[21] Appl. No.: 913,856

[22] Filed: Jul. 15, 1992

Related U.S. Application Data

[63] Continuation-in-part of Ser. No. 780,739, Oct. 18, 1991, abandoned.

[51] Int. Cl.$^6$ .................................................. G01D 21/00
[52] U.S. Cl. ............................................................ 33/623
[58] Field of Search ............................ 33/623, 614, 615, 33/617, 619, 620, 621; 355/32, 75, 79, 88, 95; 101/481

[56] References Cited

U.S. PATENT DOCUMENTS

| | | | |
|---|---|---|---|
| 2,609,613 | 9/1952 | Capers | 33/623 |
| 2,871,152 | 2/1959 | Gutzmer | 33/623 |
| 2,983,049 | 5/1961 | Andrisani . | |
| 3,160,096 | 12/1964 | Norton | 33/623 |
| 3,381,554 | 5/1968 | Ploch et al. | 33/623 |
| 3,621,582 | 11/1971 | Radencic | 33/623 |
| 3,634,009 | 1/1972 | Van Duncan . | |
| 3,695,760 | 10/1972 | Orr | 33/623 |
| 3,751,817 | 8/1973 | Willis | 33/623 |
| 4,636,067 | 1/1987 | Richards . | |
| 4,664,511 | 5/1987 | Carlson et al. | 355/91 |
| 4,785,549 | 11/1988 | Brown et al. | 33/623 |
| 4,977,683 | 12/1990 | Harder . | |
| 4,987,686 | 1/1991 | Ternes . | |
| 5,023,659 | 6/1991 | Beasely | 355/79 |
| 5,042,165 | 8/1991 | Ternes . | |

FOREIGN PATENT DOCUMENTS 535732   1/1957   Canada .

Primary Examiner—Alvin Wirthlin
Attorney, Agent, or Firm—Briggs and Morgan

[57] ABSTRACT

An image board comprising a base layer, two lower and two upper intermediate layers, and a single top bed layer. When used with compressible registration pins or spacers, the image board may optionally include either a filler layer or a spacer layer or both disposed in predetermined positions. The top bed layer of the image board defines an image layout area having at least one border region including a plurality of index holes uniformly positioned in a line equidistantly spaced along and associated with the major divisions of a ruler or scale. The newspaper registration board embodiment has a pair of rulers and lines of indexing holes disposed on opposing parallel peripheral edges of the rectangular image layout area. A predetermined number of circular or elongated registration pins are aligned parallel with and proximate to one of the rulers, and a tail pin is disposed proximate to the opposing ruler. Alternately, the registration pins may be aligned parallel with and proximate to a free side edge of the image board extending between and perpendicular to the two opposing rulers, with the tail pin disposed proximate to the opposing free side edge. In a contact board embodiment of the image board, a single ruler and line of indexing holes are disposed along one peripheral edge of the rectangular image layout area. A predetermined number of circular or elongated registration pins are aligned parallel with and proximate to the ruler, with a tail pin disposed proximate to the opposing free side edge.

19 Claims, 2 Drawing Sheets

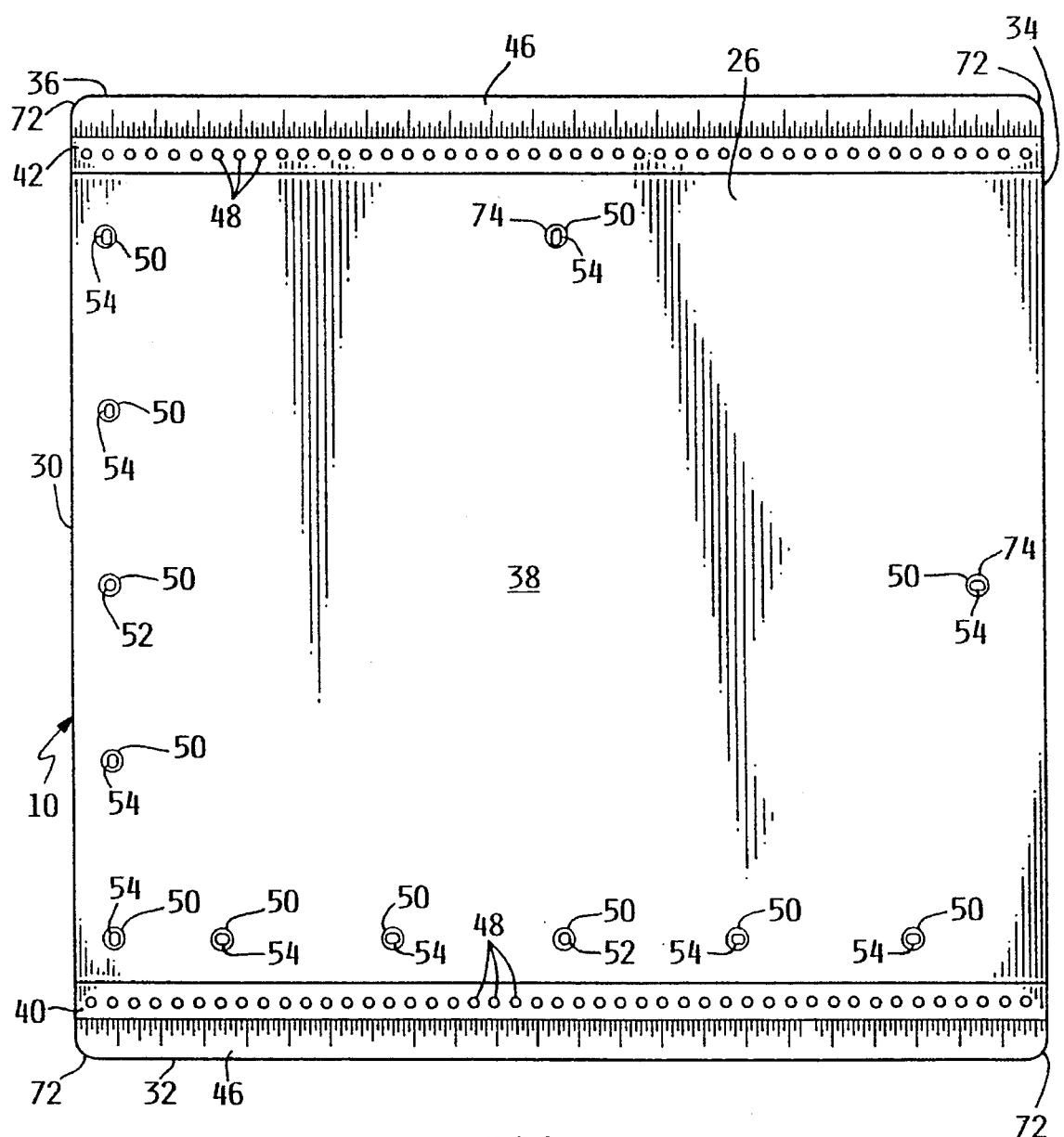
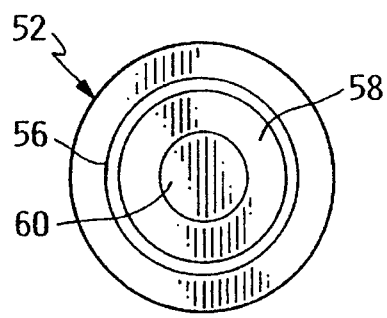
FIG. 4
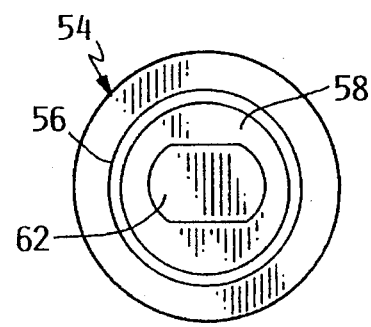
FIG. 5
FIG. 1

IMAGE REGISTRATION BOARD

This application is a continuation-in-part of U.S. patent application Ser. No. 07/780,739 filed on Oct. 18, 1991, now abandoned. The disclosure contained in that parent application and the associated file history is incorporated herein by reference as though recited completely, including the continuation-in-part application Ser. No. 07/917,456, now abandoned, related thereto.

BACKGROUND OF THE INVENTION

This invention relates generally to image registration boards of the type used in photomechanical platemaking, duplication of negatives, and particularly to those used in page makeup (stripping) and exposing plates, proofs, or contact prints utilizing uniform reproducible alignment and registration such as in a "step-and-repeat" registration system.

U.S. Pat. No. 2,983,049 to Andrisani discloses a system for accurately positioning one or more negatives, flats, screens, plates, or masking sheets, and repositioning those items relative to a fixed reference point (or to one another) in discrete repeating increments. The system comprises a ruled board having evenly spaced index holes aligned with predetermined divisions of the rulers, and registration pins or offset spacers which may be received within those index holes. This ruled board is commonly referred to as a "step and repeat board," and the current state of the art in construction of step and repeat boards is shown and described in U.S. Pat. No. 4,987,686 to Ternes. The common practice is to space the flat (screen, plate, or masking sheet) a short distance away from the ruler and spacer, and apply a paper or thin plastic stripping tab overlapping both the spacer and flat (as shown in FIG. 15 of Andrisani '049 and FIG. 1 of Ternes '686.) The stripping tab has one or more holes to receive the pin of the spacer, and the opposing end is taped or adhered directly to the negative, flat, screen, plate, or masking sheet.

Once the negative, flat, screen, plate, or masking sheet has been aligned or registered as desired using a registration pin or spacer, this particular registration may be accurately reproduced at the same location or anywhere along the ruler (or on a remote board or apparatus having a corresponding line of holes with or without a ruler) using either the same or a distinct set of negatives, flats, plates, screens, or masking sheets and a similar set of registration pins or spacers.

Page makeup may be done on a light table, step and repeat board, or similar layout device, and then subsequently transferred to the platemaker. The platemaker might be a vacuum frame, or an automated step and repeat registration machine. Factors affecting whether a vacuum frame or step and repeat machine is used in platemaking are discussed in the above referenced parent application Ser. No. 07/780,739.

Images (individual or combined negatives or flats and any associated screens, plates, or masking sheets) may be transferred to an unruled image control board having spaced registration pins for exposure in a vacuum frame, such as shown in Harder '683. It is known to provide the image control board with compressible registration pins or compressible spacers, or in some cases the vacuum frames may have an integral registration system also including compressible registration pins. Compressible registration pins and spacers were similarly discussed in the above referenced parent application Ser. No. 07/780,739 and related continuation-in-part application Ser. No.07/917,456, now abandoned, thereof, with representative examples of compressible pins on image control boards and vacuum frames being shown in U.S. Pat. Nos. 4,977,683 to Harder and 3,634,009 to Van Dusen.

As shown particularly in the Andrisani '049 patent, it is known in the art to position the rulers and lines of indexing holes along all four side edges of the image layout area of a rectangular board, or alternately along two perpendicularly adjacent edges thereof in an L-shaped configuration.

However, in many applications such as the layout of large tabloid or newspaper sheets having gutters, ganging multiple or related images on a single board, color separations with extensive color bars or test strips, non-uniform or displaced register marks, or bleeds or masks that require additional pasteboard surrounding the image, conventional image registration boards are unsuitable.

BRIEF SUMMARY OF THE INVENTION

It is therefore one object of this invention to design an image registration board particularly adapted for use with both offset spacers and compressible registration pins, and configured for specific applications employing single or parallel rulers that do not surround the image layout area or which are not perpendicularly adjacent to one another.

It is contemplated herein that the terms "image registration board" or "image board" may comprise embodiments as discussed and claimed herein without regard for their intended or actual use, including those conventionally referred to as step and repeat boards, image control boards, or contact boards. As such, the terms image registration board or image board should be construed, whenever appropriate, to include any board utilized in the uniform and reproducible layout, page makeup, stripping, and transfer or transportation of flats, screens, plates, or masking sheets, and the exposure of negative and positive flats or plates in platemakers. The term spacer relates to any pin or post assembly designed to align or hold a flat, screen, plate, or masking sheet in a predetermined or selected position on an image registration board or image board, and may include those having either a null offset, a fixed offset, or an adjustable offset relative to an index hole or similar reference point. The term registration pin may similarly relate to any fixed, adjustable, or compressible pin or assembly designed to be attached to the image board, or selectively repositioned along the image layout area of an image board for controlling and constraining the position of an image disposed within or adjacent to the image layout area.

Briefly described, the image board of this invention comprises a metal primary base layer such as aluminum, two lower intermediate layers of polyester film such as Mylar®, two upper intermediate layers of a low molecular weight melanin polymer such as Melanex-T®, and a single top bed layer of an acrylic/PVC thermoplastic sheet such as Uniroyal® DKF400 extrusion grade vinyl, preferably having a top surface defining a level hair-line cell structure.

When utilized with removable compressible registration pins of the type disclosed in co-pending application Ser. No. 07/780,739, a filler layer such as an amorphous polyester including Kodar® PETG copolyester film extrusion is preferably disposed between the base layer and the lowermost lower intermediate layer. When utilized with compressible spacers, a similar filler layer and a spacer layer of a closed cell polyethylene or polyurethane foam are preferably disposed between the uppermost upper intermediate layer and the top bed layer.

The top bed layer of the image board preferably defines an image layout area having at least one border region including a plurality of index holes uniformly positioned in a line equidistantly spaced along and associated with the major divisions of a ruler or scale.

In a newspaper registration board embodiment of the image board, a pair of rulers and lines of indexing holes are disposed on opposing parallel peripheral edges of the rectangular image layout area. A predetermined number of circular or elongated registration pins are aligned parallel with and proximate to one of the rulers, and a tail pin is disposed proximate to the opposing ruler. Alternately, the circular or elongated registration pins may be aligned parallel with and proximate to a free side edge of the image board extending between and perpendicular to the two opposing rulers, with the tail pin disposed proximate to the opposing free side edge of the image board.

In a contact board embodiment of the image board, a single ruler and line of indexing holes are disposed along one peripheral edge of the rectangular image layout area. A predetermined number of circular or elongated registration pins are aligned parallel with and proximate to the ruler, with a tail pin disposed proximate to the opposing free side edge of the image board.

BRIEF DESCRIPTION OF THE DRAWINGS

FIG. 1 is a top plan view of the newspaper registration board embodiment of the image board of this invention;

FIG. 4 is a top plan view of a round compressible registration pin; and

FIG. 5 is a top plan view of an elongated compressible registration pin.

DESCRIPTION OF THE PREFERRED EMBODIMENTS

The image board of this invention is shown in FIGS. 1-5 and referenced generally therein by the numerals 10 and 12.

Figure 2:
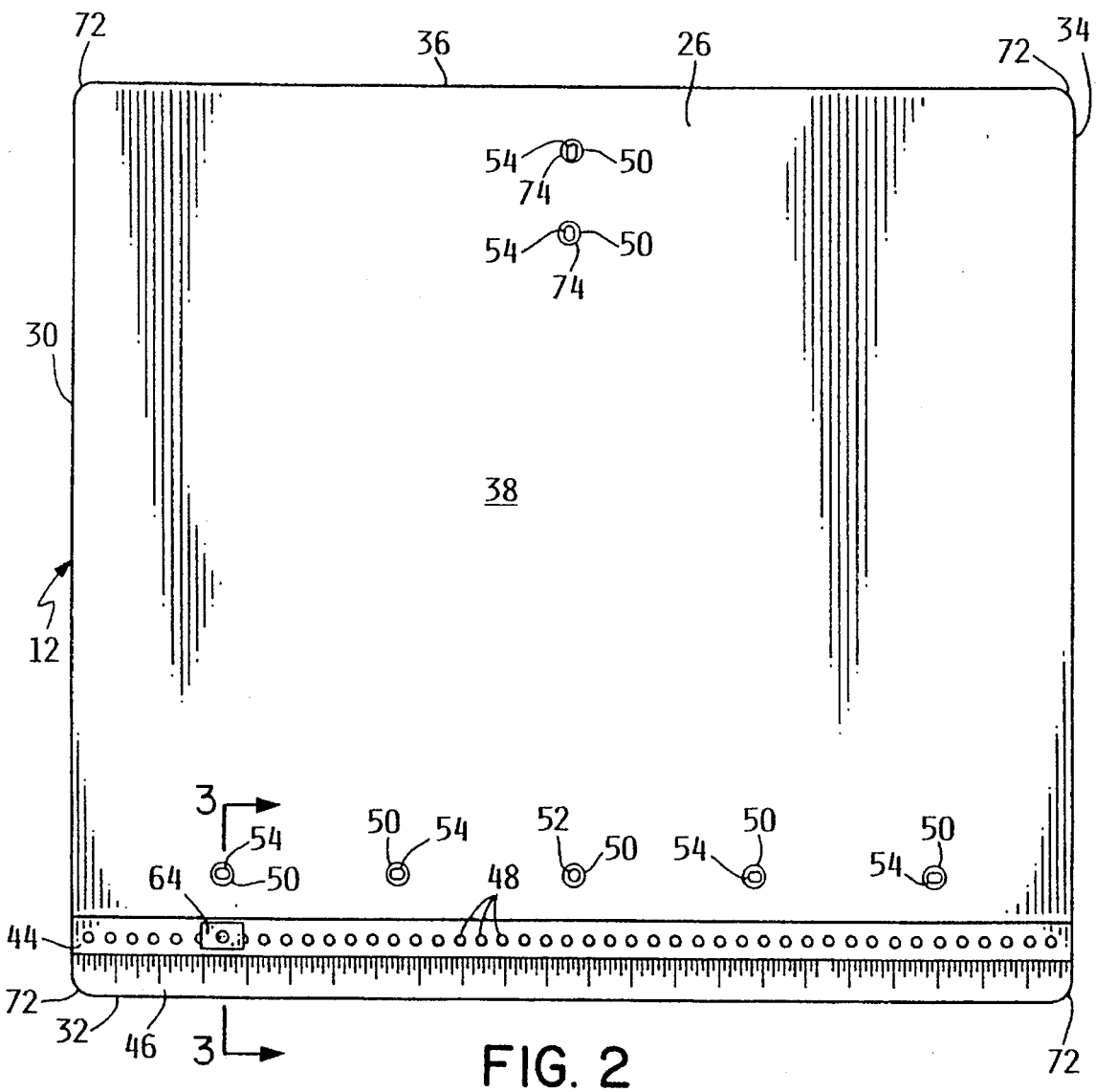
FIG. 2 is a top plan view of the contact registration board embodiment of the image board of this invention.

Referring particularly to FIGS. 1 and 2, two differing embodiments of the image board 10, 12 are depicted for exemplary purposes. The image board 10 of FIG. 1 may be referred to as a newspaper registration board or newspaper board, and the image board 12 of FIG. 2 may be referred to as a contact registration board or contact board.

Both the newspaper board 10 and contact board 12 of this invention may be constructed using a plurality of layers as described in greater detail in U.S. Pat. Nos. 4,987,686 and 5,042,165, as well as the above referenced co-pending parent U.S. patent application Ser. No. 07/780,739 and the continuation-in-part application Ser. No. 07/917,456, now abandoned thereof, including the variations and alternatives described therein, or in some applications may diverge significantly from the layered construction discussed therein.

Figure 3:
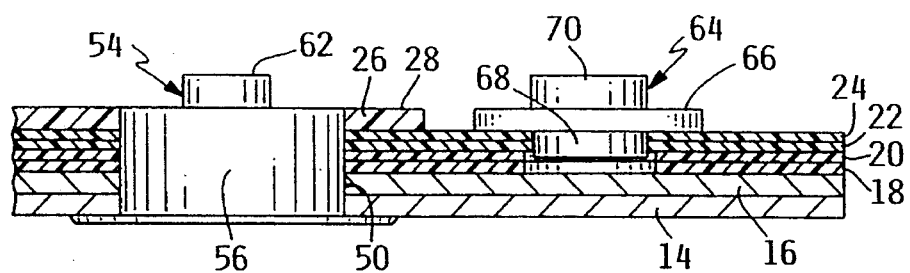
FIG. 3 is a cross section view of the image boards of FIGS. 1 and 2 taken through line 3—3 of FIG. 2.

Referring particularly to FIG. 3, the suitable and preferred embodiments of the newspaper board 10 and contact board 12 of this invention may be constructed using a plurality of layers including a generally planar primary base layer 14 of #2024 T6 alclad aluminum having a thickness of 0.025" having a smooth bottom surface, a secondary base layer or filler layer 16 of a plastic sheet material including a clear, amorphous polyester such as Kodar® PETG copolyester #6763 film extrusion having a thickness on the order of 0.040" adhered to the top surface of the primary base layer 14, two synthetic polymeric lower intermediate layers 18, 20 of a polyester film such as 0.014" thick Du Pont Mylar® adhered to one another and to the top surface of the filler layer 16, two synthetic polymeric upper intermediate layers 22, 24 of an anionic low molecular weight melanin polymer such as 0.014" thick #226 Melanex-T® adhered to one another and to the upper surface of the topmost lower intermediate layer 20, and a single synthetic polymeric top bed layer 26 of an acrylic/PVC thermoplastic sheet such as 0.030"–0.035" thick Uniroyal® DKF400 extrusion grade vinyl, preferably having a top surface 28 defining a level hair-line cell structure of uniformly oriented peaks and intersecting valleys having a depth of approximately 0.003"–0.004". Alternately, it may be appreciated that in some applications the filler layer 16 may be coextruded with the Mylar® film for layers 18, 20 to achieve any properties or characteristics as identified in the manufacturer's technical specifications relating to the Kodar® PETG film for such a coextrusion process.

Referring to FIGS. 1 and 2, it may be seen that the top bed layer 26 is inset transversely a short distance from one or two of the parallel outer peripheral edges 30, 32, 34, 36 of the image board 10, 12 such that the top bed layer 26 defines an image layout area 38.

As such, in the case of the newspaper board 10 shown in FIG. 1, the topmost upper intermediate layer 24 defines a first and second border region 40, 42 disposed on opposing sides of the image layout area 38 directly adjacent to the parallel edges 32, 36 of the newspaper board 10. In the case of the contact board 12 of FIG. 2, the topmost upper intermediate layer 24 defines a single border region 44 disposed along one side of the image layout area 38 directly adjacent to an edge 32 of the contact board 12.

Each border 40–44 is preferably imprinted with a scale or ruler 46, and defines a plurality of circular index holes 48 spaced evenly at predetermined spacing distances along the rulers 46 and having center points aligned with major ticks of the rulers 46.

The index holes 48 extend through both of the upper intermediate layers 22, 24, with the diameter of the index holes 48 in the lowermost upper intermediate layer 22 being slightly greater than the diameter of the corresponding aligned index holes 48 in the uppermost upper intermediate layer 24 to provide relief when spacer pins (not shown) are received therein.

The image boards 10, 12 further define one or more circular apertures 50 or bores extending entirely through each of the base, intermediate, and bed layers 14–26 and having a centerline substantially perpendicular thereto, contained wholly within or at least partially bounded by the image layout area 38, and spaced apart in a predetermined pattern or array on the image boards 10, 12 as discussed below.

Referring to FIGS. 1–3, it may be seen that compressible, conventional non-compressible, or adjustable registration pins 52, 54 may be engagingly received and mounted within the apertures 50. The construction of suitable compressible registration pins 52, 54 is discussed further in the above referenced U.S. patent application Ser. No. 07/780,739, including the variations and alternatives described therein.

Referring to FIGS. 4 and 5, each registration pin 52, 54 includes a base cap 56 and a retaining collar 58, and a retractable post 60, 62. The compressible registration pin 52 depicted for exemplary purposes in FIG. 4 has a retractable post 60 with a circular cross section corresponding generally to a conventional ¼" round standard registration pin (although conventional ⅛", 5/32", 3/16", or 5mm diameter pins may alternately be selected for use in other applications), whereas the retractable post 62 shown in FIG. 5 has a generally oblong shape with flat sides corresponding to a convention ¼" elongated registration pin (with a similar corresponding range or selection of sizes being suitable.) The registration pins 52, 54 and their relative positioning in FIGS. 1–5 are not shown to scale, and their placement will vary as described below depending upon the particular application and auxiliary equipment with which the image boards 10, 12 are to be utilized.

The bottom surface of the base layer 14 of the image board 10, 12 defines a reverse side opposing the top bed layer 26, and in the case of the compressible registration pins 52, 54 shown in FIGS. 3–5 each of the plurality of compressible registration pins 52, 54 are preferably selectively and removably mounted within one of the apertures 50 from the reverse side of the image board 10, 12 by slidably inserting the registration pins 52, 54 into the apertures 50 until they are frictionally engaged therein as shown in FIGS. 1–3.

Referring again to FIGS. 1–3, it may be seen that the image boards 10, 12 are utilized with one or more compressible or conventional non-compressible spacers 64 as discussed further in the above referenced co-pending parent U.S. patent application Ser. No. 07/780,739 and the continuation-in-part application Ser. No. 07/917,456, now abandoned thereof, including the variations, alternatives, and conventional devices described therein.

Each spacer 64 generally includes a base plate 66, one or two depending bottom pins 68, and a fixed or compressible top pin or post 70 having a predetermined null, fixed, or adjustable offset relative to the bottom pins 68 and index holes 48. The depending bottoms pins 68 are slidably received within and frictionally engage a pair of the index holes 48, with the top pin or post 70 being aligned vertically with one of the pair of index holes 48 or offset a predetermined fractional distance between the pair of the index holes 48. The top surface of the base plate 66 preferably lies generally coplanar with the top surface of the top bed layer 26 which defines the image layout area 38, such that the top pin or post 70 extends upwardly above the top surface of the top bed layer 26 sufficient that a plurality of flats or plates (not shown) may be placed on image layout area 38 with registration holes in the flats or plates receiving the top pin or post 70 therethrough.

The corners 72 of the image board 10, 12 are preferably rounded or radiused, as shown in FIGS. 1 and 2.

Referring particularly to FIG. 1, it may be seen that in the newspaper board 10 embodiment, one each of a pair of borders 40, 42, rulers 46, and lines of index holes 48 are disposed along and directly adjacent or proximate to the opposing parallel side edges 32, 36 of the image board 10 on opposing sides of the rectangular image layout area 38. A predetermined number of circular or elongated registration pins 52, 54 are mounted within a predetermined array of apertures 50 aligned parallel with and proximate to one of the borders 40 and rulers 46.

For exemplary purposes, FIG. 1 shows five apertures 50 with one central circular registration pin 52 and two pair of elongated registration pins 54 disposed on each side thereof, each one of the apertures 50 that receive the opposing pairs of elongated registration pins 54 being spaced an equal distance apart from the aperture 50 receiving the center circular registration pin 52. Any number and array of the apertures 50 and combination of the circular registration pins 52 and elongated registration pins 54 may be utilized depending upon the placement and orientation of the holes punched in the image (one or more negatives, flats, plates, screens, or masking sheets) for the registration system employed in or required by a particular platemaker or printing press. For example, the central circular registration pin 52 could be replaced by an elongated registration pin 54 oriented with the major axis perpendicular to the ruler 46, thus maintaining a definite "master" reference or registration point relative to the corresponding ruler 46. One registration pin 50, 52 could be disposed on each side of this master reference point, or a single registration pin 52, 54 could be disposed on one or the other side of the master reference point, as "ancillary" reference or alignment points.

It may be readily appreciated that a circular registration pin 52 would permit no degrees of freedom of movement (selective movement or that resulting from factors such as thermal expansion) when received within a circular aperture punched in the image. Alternately, a circular registration pin 52 would permit one degree of freedom of movement if received within an elongated aperture punched in the image. A circular registration pin 52 received within a circular aperture having a corresponding diameter, or an elongated registration pin 54 received within an elongated aperture having a corresponding length and width, would define a master reference point permitting registration in two directions. Conversely, a circular registration pin 52 received within an elongated aperture whose width corresponds to the diameter of the circular registration pin 52, or an elongated registration pin 54 received within an elongated aperture having a width corresponding to the width of the elongated registration pin 54 but a greater length, would define a master reference permitting registration in only one direction and permit lateral or transverse linear movement in a second direction perpendicular to the first. In most applications, a registration system in which the master reference point is maintained in only one direction will have the major axes of the elongated registration pins 54 or elongated apertures (and therefore the direction of any transverse or lateral linear movement) oriented perpendicular to the most closely proximate ruler 46. If a master reference point is maintained in two directions, elongated apertures in the image will normally be oriented to permit thermal expansion of the image along lines extending between and parallel with the master reference point and the corresponding aperture. The various arrays and patterns for placement of a master reference point, the degrees of freedom associated with that master reference point, and the selection of circular or elongated registration pins 52, 54 and apertures for the ancillary alignment or reference points will be dictated by the particular characteristics of the application and the constraints imposed by the prepress or printing apparatuses utilized. I coined two new phrases in the specification that eliminate the problems you noted concerning the various arrangements and different kinds of registration pins that could go in row. As such, the term master reference point will usually refer to any registration pin 52, 54 in the row that normally permits no more than one degree of freedom of linear movement of the image, and that one degree of freedom will be perpendicular to the corresponding ruler 46. An ancillary alignment or registration point will usually refer to any registration pin 52, 54 that normally permits at least one degree of freedom and is not a master reference point (or a tail pin, as discussed below). An ancillary alignment point need not be disposed in the row with a master reference point.

In the example of the newspaper board shown in FIG. 1, a tail pin aperture 74 is disposed proximate to the opposing border 42 and ruler 46 and contained within or at least partially bounded by the image layout area 38. The tail pin aperture 74 is aligned with the center circular registration pin 52 adjacent the opposing border 40 and ruler 46 and receives an elongated registration pin 54, with the major or elongated axis of the elongated registration pin 54 oriented perpendicular with the borders 40, 42 and rulers 46. The tail pin aperture 74 is therefore outside of and remote from the row of apertures 50 forming the remainder of the pattern or array of apertures 50 receiving the plurality of registration pins 52, 54.

Alternately, as shown in FIG. 1, the array or row of apertures 50 receiving the registration pins 52, 54 may be aligned parallel with and proximate to an exposed or free edge 30 of the image board 10 extending between and perpendicular to the two opposing borders 40, 42 and rulers 46, with the corresponding tail pin aperture 74 being disposed proximate to the opposing exposed or free edge 34 and similarly oriented with the major or elongated axis of the elongated registration pin 54 perpendicular to the line or array of apertures 50 receiving the circular and elongated registration pins 52, 54 proximate to the free edge 30.

Referring particularly to FIG. 2, it may be seen that in the contact board 12 embodiment a single border 44, ruler 46, and line of indexing holes 48 are disposed along one side edge 32 of the rectangular image layout area. A predetermined number of apertures 50 receiving either circular registration pins 52 and elongated registration pins 54 are aligned in a row parallel with and proximate to the border 44 and ruler 46, with a tail pin aperture 74 receiving an elongated registration pin 54 disposed proximate to the opposing free edge 36 and aligned with the aperture 50 receiving the center circular registration pin 52.

Again for exemplary purposes, FIG. 2 shows a central aperture 50 receiving a circular registration pin 52 with two pair of apertures 50 receiving elongated registration pins 54 disposed on each side thereof, each one of the apertures 50 receiving the opposing pairs of elongated registration pins 54 being spaced an equal distance apart from the center aperture 50. Any number and array of the apertures 50 and circular registration pins 52 and elongated registration pins 54 may be utilized as with the newspaper board 10, however a center circular registration pin 52 with elongated registration pins 54 disposed on each side thereof is a conventional arrangement.

In the example of the contact board shown in FIG. 2, alternate positions for two tail pin apertures 74 are provided, one tail pin aperture 74 being disposed more closely adjacent to the free edge 36 than the second, although it is understood that only one tail pin aperture 74 will normally be utilized to receive an elongated registration pin 54 at any given time.

While the preferred embodiments of the above image boards 10, 12 have been described in detail with reference to the attached drawing Figures, it is understood that various changes and adaptations may be made in the image boards 10, 12 without departing from the spirit and scope of the appended claims.

What is claimed is:

1. In an image board for use with at least one registration pin and at least one spacer to register a first image, said at least one spacer having a bottom pin, said image board having a top bed layer defining an image layout area, said image layout area having a plurality of peripheral edges, said image board having a plurality of sides edges disposed along and proximate to said peripheral edges of said layout area, the improvement comprising:

a first border region including a first plurality of index holes disposed generally in alignment with one another and spaced apart generally equidistantly along said first border region to receive the bottom pin of the spacer therein, the at least one spacer being selectively movable between different positions along said first plurality of index holes, said first border region being positioned generally proximate to a first one of the plurality of peripheral edges of the image layout area, the image layout area having a second one and a third one of the plurality of peripheral edges, each of said second one and said third one of the plurality of peripheral edges being oriented generally perpendicular to said first one of the plurality of peripheral edges, each of said second one and said third one of the plurality of peripheral edges not having a distinct plurality of index holes disposed generally therealong; and at least one aperture extending through the image board and disposed in a predetermined position relative to said first plurality of index holes, each one of said at least one aperture being at least partially bounded by the image layout area, each one of the at least one aperture receiving one of the at least one registration pin therein such that at least a portion of the at least one registration pin extends above the image layout area, wherein the registration of the first image in a first linear direction generally perpendicular with said first plurality of index holes and a second linear direction generally parallel with said first plurality of index holes is determined only by the at least one registration pin and is not selectively adjustable by the at least one spacer.

2. The image board of claim 1 wherein the image board has a reverse side opposing the top bed layer, and further wherein each of the at least one registration pin is capable of being selectively and removably mounted within the at least one aperture from said reverse side.

3. The image board of claim 1 wherein the number of the at least one aperture is greater than one and defines a predetermined pattern, said predetermined pattern being a row disposed along a generally straight line.

4. The image board of claim 3 wherein the row is disposed generally proximate to and parallel with the first border region.

5. The image board of claim 3 wherein the row includes a master reference point, said master reference point permitting registration in one direction.

6. The image board of claim 3 wherein the row includes a master reference point, said master reference point permitting registration in two generally perpendicular directions.

7. The image board of claim 3 wherein each of the at least one registration pin is selected from a group comprising: a circular registration pin and an elongated registration pin.

8. The image board of claim 3 further comprising:

a tail pin aperture, said tail pin aperture being disposed outside of and remote from the row and generally proximate to a fourth one of the plurality of peripheral edges of the image layout area opposing the first border region.

9. The image board of claim 3 wherein the row includes a master reference point, the image board further comprising:

a tail pin aperture, said tail pin aperture being disposed outside of and remote from the row and generally aligned with the master reference point along a line oriented generally perpendicular to the row.

10. The image board of claim 1 further comprising:

a second border region including a second plurality of index holes disposed generally equidistantly along said second border region, said second border region being positioned generally proximate to a fourth one of the plurality of peripheral edges of the image layout area, said second border region generally opposing the first border region across the image layout area.

11. The image board of claim 10 wherein the second border region is generally parallel with the first border region.

12. The image board of claim 10 wherein the number of the at least one aperture is greater than one and defines a predetermined pattern, said predetermined pattern being a row disposed along a generally straight line.

13. The image board of claim 12 wherein the row is disposed generally proximate to and parallel with the first border region.

14. The image board of claim 12 further comprising:
a tail pin aperture, said tail pin aperture being disposed outside of and remote from the row and generally proximate to the fourth one of the plurality of peripheral edges of the image layout area and the second border region.

15. The image board of claim 12 wherein the row includes a master reference point, the image board further comprising:
a tail pin aperture, said tail pin aperture being disposed outside of and remote from the row and generally aligned with the master reference point along a line oriented generally perpendicular to the row.

16. The image board of claim 12 wherein the row is disposed generally perpendicular with the first border region and the second border region.

17. The image board of claim 12 wherein the row is disposed generally proximate to and parallel with either the second one or the third one of the plurality of peripheral edges of the image layout area.

18. The image board of claim 17 further comprising:
a tail pin aperture, said tail pin aperture being disposed outside of and remote from the row and generally proximate to either the second one or the third one of the plurality of peripheral edges of the image layout area.

19. The image board of claim 17 wherein the row includes a master reference point, the image board further comprising:
a tail pin aperture, said tail pin aperture being disposed outside of and remote from the row and generally aligned with the master reference point along a line oriented generally perpendicular to the row.

* * * * *